(12) United States Patent
Storti et al.

(10) Patent No.: US 6,583,986 B1
(45) Date of Patent: Jun. 24, 2003

(54) METHOD AND APPARATUS FOR MANAGING THERMAL ENERGY EMISSIONS

(75) Inventors: William J. Storti, Haverford, PA (US); Keith Sibley, Willow Grove, PA (US); Shlomo Ovadia, San Jose, CA (US); Steven Kimball, Leucadia, CA (US); Barry Falvo, Lower Providence, PA (US)

(73) Assignee: General Instrument Corp., Horsham, PA (US)

( * ) Notice: Subject to any disclaimer, the term of this patent is extended or adjusted under 35 U.S.C. 154(b) by 0 days.

(21) Appl. No.: 09/862,844

(22) Filed: May 21, 2001

(51) Int. Cl.$^7$ ................................................. H05K 7/20
(52) U.S. Cl. ....................... 361/704; 361/707; 361/714; 361/719; 361/720; 165/80.2; 165/185; 174/252
(58) Field of Search ................................. 361/683, 686, 361/687, 690, 685, 704, 707–710, 714–717, 719–727, 752, 784, 790, 692, 688; 165/80.2, 80.3, 80.4, 185; 174/15.1, 16.3, 252; 257/706–727; 364/708.1; 312/223.1, 223.2

(56) References Cited

U.S. PATENT DOCUMENTS

| 5,426,701 | A | * | 6/1995 | Herrmann et al. | ............ | 380/52 |
| 6,141,211 | A | * | 10/2000 | Strickler et al. | ............ | 361/685 |
| 6,278,609 | B1 | * | 8/2001 | Suzuki et al. | ............ | 361/704 |
| 6,302,704 | B1 | * | 10/2001 | Belanger | ............ | 439/67 |

FOREIGN PATENT DOCUMENTS

JP          409171540 A   *   6/1997   ..........  G06K/17/00

* cited by examiner

Primary Examiner—Boris Chervinsky
(74) Attorney, Agent, or Firm—Steven L. Nichols; Ronald P. Kananen; Rader, Fishman & Grauer PLLC

(57) ABSTRACT

A guide member for accommodating a removable module is formed from a thermally conductive material having at least one thermally conductive element to provide a new primary heat dissipation path to manage thermal energy generated by operation of the module. The guide member may also be used to guide the module into proper connection with a module connector which electrically connects the circuit on the module with other circuitry. A plurality of thermally conductive elements, such as spring fingers, ribs and fins, provide additional thermal heat dissipation paths and enhance the rigidity of the guide members.

18 Claims, 3 Drawing Sheets

METHOD AND APPARATUS FOR MANAGING THERMAL ENERGY EMISSIONS

FIELD OF THE INVENTION

The present invention relates to the field of thermal energy management, and more particularly to a method and apparatus for dissipating thermal energy produced by removable modules, such as modules used in cable television systems.

BACKGROUND OF THE INVENTION

There are currently various devices on the market using removable modules that can be inserted into an insertion port for electrical connection with another device. These removable modules may contain a programmable circuit containing, for example, proprietary algorithms for providing information or controlling access to another device. The programmable circuit can include, for example, a Static Random Access Memory (SRAM) or the like to form a confidential or secured portion of the removable module memory in which the proprietary algorithm is stored.

Cable television systems in particular may use removable modules to allow subscribers controlled access to dozens or even hundreds of channels of television programming. The current trend is for cable television systems to provide additional services such as premium channels, pay-per-view programming, video-on-demand programming and even internet access. In advanced cable television systems, each subscriber is typically provided with a set-top terminal. The set-top terminal is a box of electronic equipment that is used to connect the subscriber's television, or other electronic equipment, to the cable television system. The set-top terminal processes the signal received from the cable television system to provide the services of the cable system to subscribers.

As the premium services of the cable television system expand, security techniques for those premium services become crucial to ensure that only subscribers who have paid for the premium services have access to them. For example, premium channels, such as some movie channels, are scrambled before transmission to prevent unauthorized reception and viewing of those channels. Subscribers who pay additional fees to receive the premium channel or channels are provided with the means to descramble and view the premium channel or channels.

There are many techniques for controlling the remote descrambling of scrambled television signals. Typically, a system subscriber who has paid to receive the scrambled premium channel or channels is provided with a descrambler unit that is connected between the source of the television signal source (e.g., a cable feed or a satellite receiver) and the subscriber's television set. While this descrambler unit may be a self-contained unit, descrambling circuitry is frequently and preferably incorporated into the subscriber's set-top terminal.

Unfortunately, proprietary algorithms used by descrambling circuitry can frequently, with enough effort, be "broken" or duplicated by an unauthorized party. Thereafter, unauthorized means of descrambling the cable system's premium channels might be made available to subscribers. To avoid this, the operator of the cable system may need to periodically change the proprietary algorithm used to scramble and descramble premium channels.

If the subscriber's descrambling circuitry is incorporated in a set-top terminal, the old descrambling circuitry must be removed and new descrambling circuitry inserted. To facilitate this process, the descrambling circuitry can be included in the removable modules to plug into a removable module port of the set-top box. The removable modules in this context are also known as point-of-deployment (POD) modules. When the descrambling circuitry is to be changed or upgraded, the old removable module can be pulled from the set-top box, and a module with the new circuitry is inserted in the port. Other elements or programming of the set-top terminal that need to be updated periodically can also be provided in the removable module.

In this application, the removable module is meant to be removed when the cable television company providing the services decides to update or change the proprietary decrypting algorithm or when the cable subscriber changes cable service providers and thus changes decrypting algorithms. Such a change may occur infrequently, in the case when the cable subscriber does switch cable service providers, or regularly as a security precaution, when improved security or other features become available for inclusion in the set-top boxes, or after the decrypting algorithm has been broken by an unauthorized user. Additionally, the inadvertent removal of the removable module typically renders the set-top box non-functional.

Moreover, as noted above, the current trend is for the amount and diversity of services provided by cable television companies to expand to include, for example, the transmission of computer data, a greater quantity of television programming and, eventually, telephone calls. To accommodate the existing and new services, set-top terminals will eventually require many more ports than presently exist. This will reduce the space available for including a separate port for a removable module.

Placing the removable module underneath and, perhaps, inside the casing of the set-top terminal, however, contributes to other problems in the design of the set-top box. Specifically, the electronic circuitry of the removable module inherently generates heat or thermal energy during operation. This thermal energy must be dissipated efficiently to prevent accumulation and overheating that may damage or be detrimental to the module or the device in which the module is inserted. Although prior art devices using PCMCIA cards attempt to dissipate heat away from the card by conducting heat through the card contacts to a main board in the device, this method risks damage to the main board if the amount of heat generated by the card overcomes the main board's ability to dissipate it. Further, removable modules are being developed that generate more heat than PCMCIA cards, making efficient dissipation of heat even more important. Note that control and dissipation of thermal energy is also important if the removable module is used in applications other than cable television set-top boxes.

Therefore, there is a need in the art for an improved method and apparatus for managing the thermal energy generated by the operation of a removable module when it is inserted into a removable module port.

SUMMARY OF THE INVENTION

It is an object of the present invention to meet the above-described needs and others. Specifically, it is an object of the present invention to provide an improved method and apparatus for managing the thermal energy generated by the operation of a removable module in a set-top box of a cable television system or any other device requiring insertion of a removable module into a removable module port.

Additional objects, advantages and novel features of the invention will be set forth in the description which follows or may be learned by those skilled in the art through reading these materials or practicing the invention. The objects and advantages of the invention may be achieved through the means recited in the attached claims.

The invention is directed to a guide member, preferably a guide member for receiving a removable module that electrically connects to circuitry when the removable module is inserted into the guide member. In one embodiment, the guide member forms or is otherwise disposed in a removable module port and includes a first surface that is in physical contact with the removable module when the removable module is inserted into the guide member and at least one thermally conductive element on the first surface that provides a physical heat dissipation path from the exterior of the removable module to the exterior of the guide member and into the ambient air. The guide member is made of a thermally conductive material to ensure an efficient transfer of thermal energy away from the removable module.

The guide member may align and guide the removable module into proper connection with a module connector in the removable module port. This facilitates the insertion and connection of the module to the set-top box.

The present invention also comprises the method of implementing the apparatus described above. Specifically, the present invention includes a method of managing thermal energy dissipation in a set-top box for use in a cable television system, where the set-top box has a removable module port formed at least in part by the guide member for receiving a removable module therein. The method is performed by conducting thermal energy away from the removable module to ambient air through at least one surface of the guide member that is in physical contact with the removable module when the removable module is placed in the guide member.

BRIEF DESCRIPTION OF THE DRAWINGS

The accompanying drawings illustrate the present invention and are a part of the specification. Together with the following description, the drawings demonstrate and explain the principles of the present invention.

FIGS. 2a and 2b are top and side views, respectively of the inventive structure shown in FIG. 1a.

DETAILED DESCRIPTION OF THE PREFERRED EMBODIMENTS

Figure 1A:
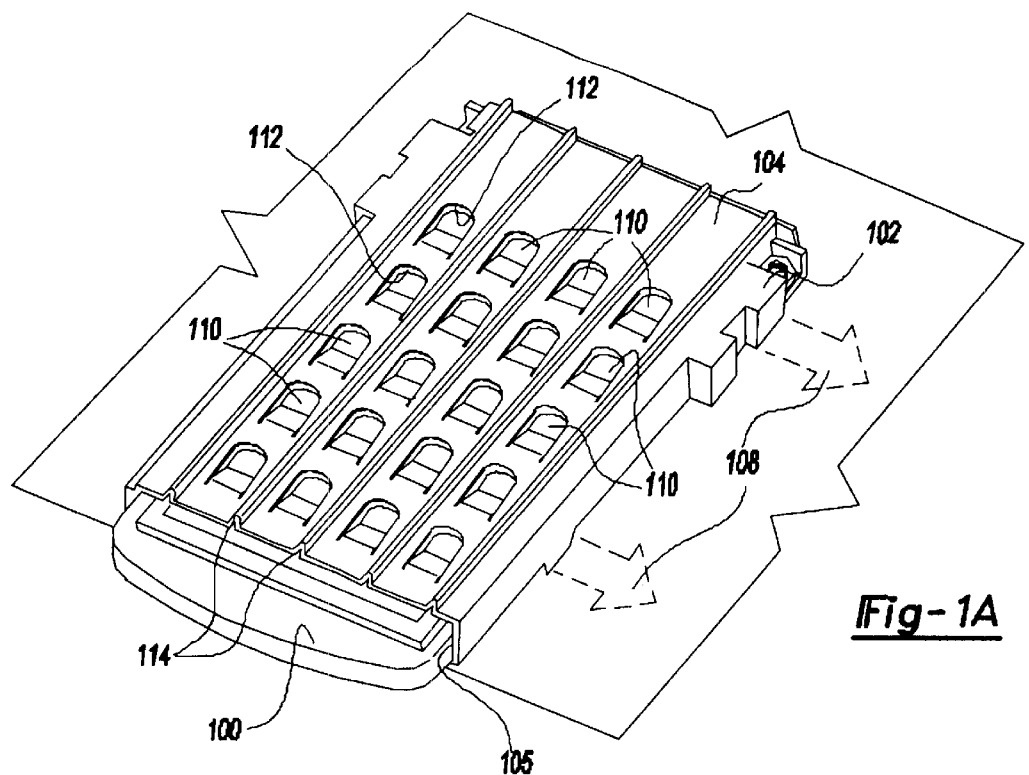
FIGS. 1a and 1b are a perspective view and a representative diagram, respectively, of a thermal energy management system incorporating one embodiment of the inventive structure.
Figure 1B:
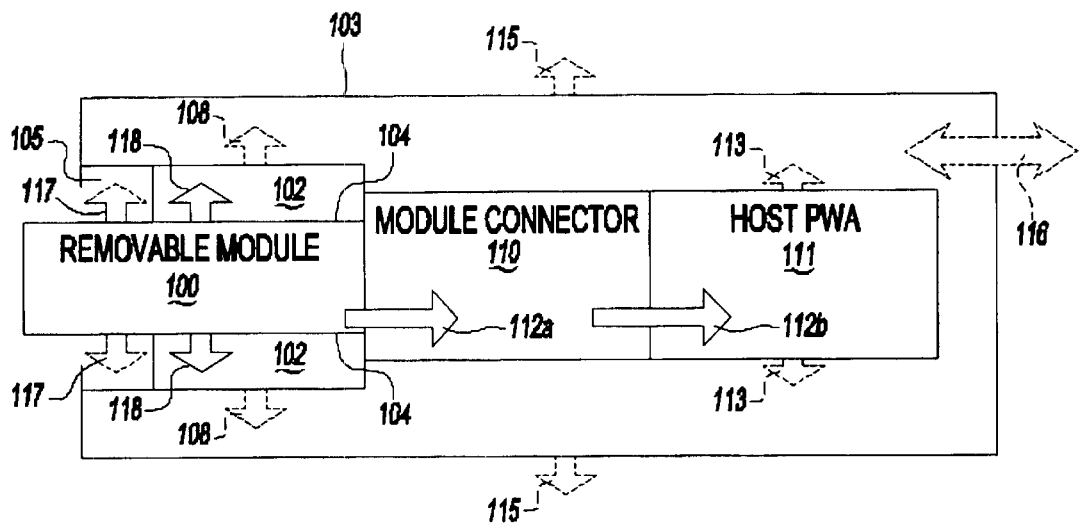

FIG. 1a is a perspective view of a removable module 100 that is inserted into one embodiment of the inventive guide member 102, while FIG. 1b is a simplified representative diagram of the removable module 100 in the guide member 102 that shows the manner in which thermal energy travels through the guide member 102 into the ambient air within and outside a device 103. As can be see in FIG. 1a, the guide member 102 has at least one surface 104 that is adjacent to, and in physical contact with, the exterior of the removable module 100 when the removable module is inserted into the guide member 102. Consequently, when the module 100 is inserted in a removable module port 105 formed by the guide member 102, the surface 104 of the guide member 102 contacts the module 100 and thereby aligns the module 100 with, for example, another electronic component via a module connector (not shown) to facilitate correct connection.

Typically, the connection between the module 100 and the module connector includes a series of pins (not shown) that mate with pin receptacles on the other component. By aligning the module 100 with the module connector, the guide member 102 helps prevent any damage or bending to the pins of the connection potentially caused when a user forces the module 100 against the module connector without properly aligning the pins and pin receptacles of the connection.

Additionally, the guide member 102 provides an additional thermal energy transfer path 108 through which thermal energy is conducted away from the module 100. In such a case, the guide member 102 is preferably made of a thermally conductive material, e.g., a metal or alloy. The surfaces 104 of the guide member 102 are preferably in the form of relatively flat plate-like structures to provide a large surface area for contacting the module 100, thereby providing a larger surface through which thermal energy dissipation can occur.

More particularly, when at least one surface of the guide member 102 is in physical contact with the module 100 when the module is inserted in the port 102, the thermal energy from the module 100 will be conducted from the exterior surface of the module 100 through the guide member surface 104 into the ambient air, thereby preventing the module 100 from overheating.

Preferably, the guide member surface 104 physically contacts a majority of the top and bottom side surfaces of the module 100. Increasing the area of physical contact between the module 100 and the guide member 102 increases the size and effectiveness of the thermal energy conduction path 108 away from the module 100. Additional thermally conductive surfaces may also be provided on the sides of the module 100 to provide additional physical contact.

FIG. 1b illustrates one example of thermal energy management in the inventive system. As shown in FIG. 1b, the guide member 102 is disposed in a hollow device 103, such as a set-top box chassis. The port 105 for the removable module 100 includes a module connector 110 that links the module 100 electrically to circuitry such as, for example, a printed wire assembly 111. The link provided by the module connector 110 provides power to the module 100 and allows the use of any programming, algorithm or processing capability resident in the module 100.

As can be seen in FIG. 1b, there are several paths through which the thermal energy generated by the module 100 can be dissipated to maintain the module 100 and the device 103 within an acceptable operating temperature range. For example, heat is conducted through a conduction path 112a from the module 100 through the module connector 110. This heat is, in turn conducted through a conduction path 112b to the circuitry 111 of the device 103, released by convection 113 into the ambient air within the device 103. Heat within the device 103 is released by convection 115 from the exterior of the chassis or through an exchange path 116. The exchange path may include a vent, with or without a fan, in the device 103.

Alternatively, thermal energy is released by convection 117 from the exterior surface of the module 100 into the ambient air within the device 103. As described above, heat within the device 103 is then released by convection 115 from the exterior of the chassis 103 or through the exchange path 116. Additionally, the guide member 102 provides an additional thermal energy transfer path 118 through which thermal energy is conducted away from the module 100.

Consequently, as the guide member 102 is in physical contact with the module 100 when the module is inserted in the port 105, thermal energy from the module 100 will be conducted via a conduction path 118 from the exterior surface of the module 100 through the guide member 102 and into the device 103. The thermal energy escaping from the module 100 into the device 103 via the conduction path 118 is then dissipated from the device 103 by convection 115 from the exterior surface of the device 103. The device may also release heat by convection into the ambient air within the chassis 103 which can be released through the exchange 116.

The guide member 102 in this embodiment also has a plurality of spring fingers 110 that are preferably punched or formed out of the guide member 102. The spring fingers 110 help provide more reliable physical and thermal contact between the module 100 and the guide member 102. Each spring finger 110 may create an opening 112 when it is formed and preferably extends downward from a guide member surface 104. The spring fingers 110 shown in FIG. 1 can be formed into any desired shape, such as a "C", "V", or "M" shape, as long as they protrude from the guide member surface 104. Of course, the opening 112 will not be created if the spring fingers 110 are formed in a manner that leaves the guide member surface 104 unbroken. The guide member 102 may also include a series of fins 114. The spring fingers 110 and fins 114 provide structural rigidity to the guide member 102 and also increase the surface area through which heat can dissipate. Of course, the spring fingers 110 and the fins 114 do not both need to be incorporated into the same structure and instead can be used alone in the guide member 102.

As can be seen in FIG. 1, each spring finger 110 and fin 114 provides an additional thermal conduction path through which thermal energy from the module 100 can be released into the ambient air. Further, because the spring finger 110 is in direct physical contact with the module 100 when the module 100 is inserted into the guide member 102, the thermal conduction path 108 formed by the spring finger 110 efficiently moves heat away from the module 100. The thermal energy escaping from the module 100 into the ambient air via the thermal energy conduction paths 108 is then dissipated from the guide member 102 by convection from the exterior surface of the guide member 102.

In this way, the present invention provides new primary thermal energy dissipation paths for the module 100, through both the guide member surfaces 104 and through the spring fingers 110 and fins 114 on the guide member 102. This allows the module 100 to more easily maintain an acceptable operating temperature. Additionally, the thermal energy conduction paths 108 through the guide member, spring fingers 110 and fins 114 conduct heat efficiently away from the module into the ambient air, bypassing the circuitry of the device, such as a set-top box, in which the guide member 102 is installed. This allows the circuitry of the device to maintain an acceptable operating temperature more easily.

Figure 2A:
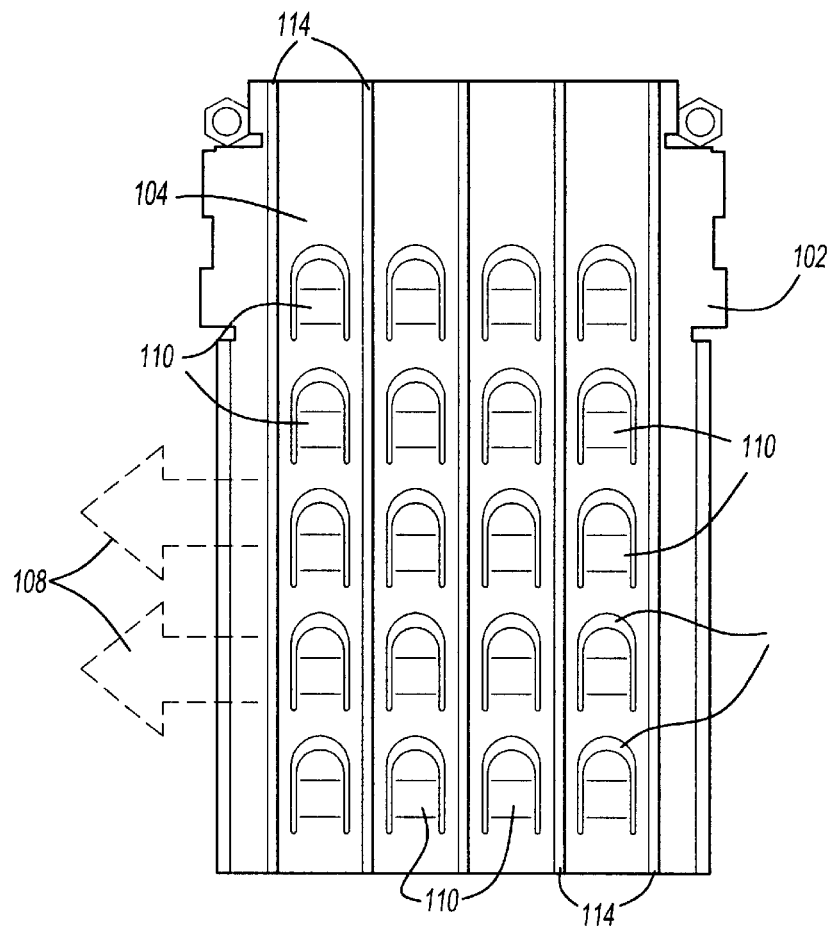
Figure 2B:
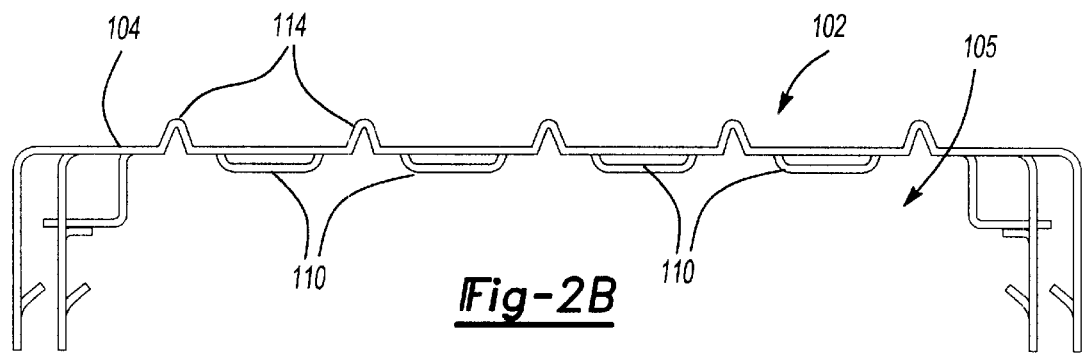

FIGS. 2a and 2b are top and side views, respectively, of a guide member 102 having the spring fingers 110 and fins 114 described above. In FIGS. 2a and 2b, the spring fingers 110 have a "C" shaped profile, but any shape can be used as long as the spring fingers 110 extend into the guide member 102 to allow direct physical and thermal contact with the module when it is inserted. In addition to the plurality of heat dissipating spring fingers 110, the series of fins 114 are positioned adjacent to spring fingers 110 in this embodiment. As can be seen in FIG. 2b, the fins 114 protrude above the surface 104 of the guide member 102, while the spring fingers 110 extend into the port area 105 in which the module 100 is to be inserted.

Figure 3A:
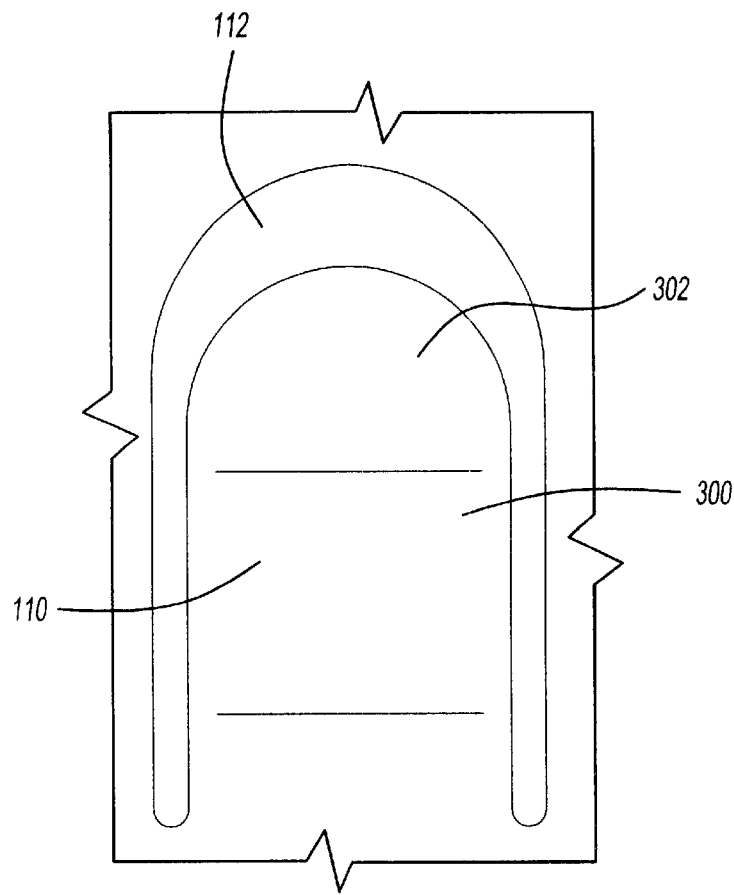
FIGS. 3a and 3b are top and side views, respectively, of a spring finger used in one embodiment of the inventive structure.
Figure 3B:
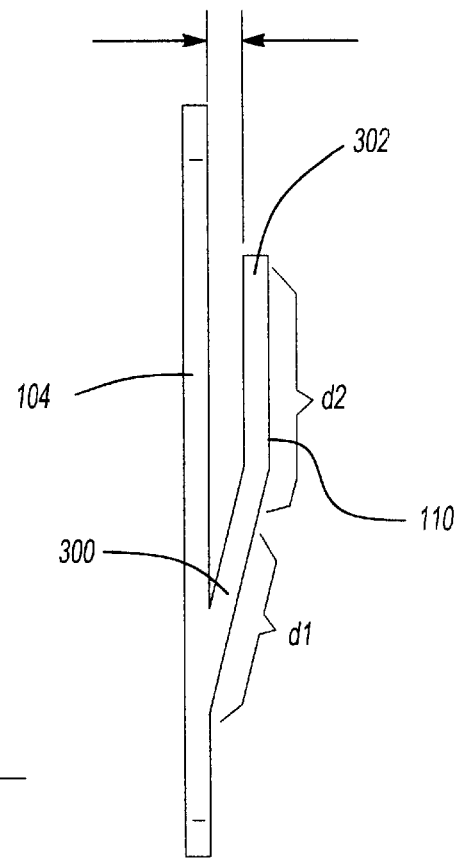

FIGS. 3a and 3b offer a further view of the spring finger 110 in a preferred embodiment of the present invention. As can be seen in the figures, if the spring finger 110 is formed by punching down the fingers 110 from the guide member surface 104, the formation process leaves an opening 112 having roughly the same outline (in this case, a C-shape) as the spring finger 110. A first planar portion 300 of the spring finger 110 extends away from the guide member surface 104 and terminates at distance d1, and a second planar portion 302 extends parallel to the guide member surface 104 at the distance d1. The second planar portion 302 is preferably deflectable when a module 100 is inserted so that there is good physical and thermal contact between the module 100 and second planar portion 302 the spring finger 110. Further, the spring finger 110 is preferably integrally formed into the guide member 102 from a single piece of material, such as stainless steel.

Figure 4:
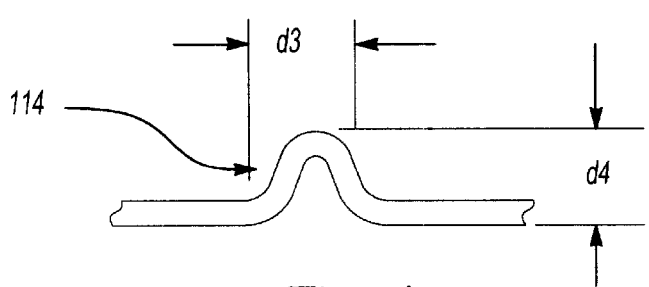
FIG. 4 side view of a fin used in an embodiment of the inventive structure.

FIG. 4 shows a side view of the fin 114 which is integrally formed in the guide member 102 in this embodiment. Each fin 114 preferably has, but is not limited to, a width d3 and a height d4. The fins 114 generally are adjacent to and in parallel with a plurality of columns of spring fingers 110, an example of which can be seen in FIGS. 1 and 2.

The use of the guide member 102 of the present invention to conduct heat away from the module can be enhanced by modifying the design of the module itself 100. For example, the module 100 should be designed to achieve a uniform temperature distribution across its surface, which is preferably metallic, for efficient conduction of thermal energy into the guide member 100. Additionally, the removable module 100 typically comprises various components, for example integrated circuits and a battery, that have different power dissipations. A conforming thermally conductive material can be placed inside the housing of the removable module between these various components and the housing to help generate a substantially uniform heat distribution on the exterior surface of the module housing. Moreover, the components of the module 100 that generate the most heat should be placed nearest the end of the module 100 that connects to the module connector. Components of the module 100 that generate little heat, such as a battery, should be placed at the other end of the module 100. This arrangement can provide a shorter thermal path for heat from the module components that produce the most heat into the guide member 102.

With respect to the guide member 102 structure itself, as noted above, the spring fingers 110 and fins 114 are preferably all integrally formed in the guide member 102. The material used for the guide member 102 should be thermally conductive and flexible enough so that the spring fingers 110 will deflect when a module 100 is inserted into the guide member 102 to provide good physical and thermal contact.

As described above, the present invention is a guide member for receiving a removable module in which generated thermal energy can be more effectively managed and dissipated than in prior art devices. The present invention therefore allows better control of thermal energy generated by removable modules, improving module performance.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A guide member for receiving a removable module that electrically connects to circuitry when the removable module is inserted into the guide member, comprising:
    a first surface having at least a portion that is in physical contact with the removable module when the removable module is inserted into the guide member; and
    at least one thermally conductive element on the first surface that provides a thermal energy dissipation path from an exterior of said removable module to an exterior of the guide member,
    wherein the guide member is made of a thermally conductive material; and
    wherein the at least one thermally conductive element comprises a spring finger that is in physical contact with said removable module when said removable module is inserted into the guide member.

2. The guide member of claim 1, wherein a plurality of thermally conductive elements are disposed on the guide member.

3. The guide member of claim 1, wherein the at least one thermally conductive element comprises a plurality of spring fingers in physical contact with said removable module when said removable module is inserted into the guide member.

4. The guide member of claim 1, wherein the spring finger is integrally formed with the guide member.

5. The guide member of claim 4, wherein the spring finger has a planar portion that extends below the first surface.

6. The guide member of claim 1, wherein the spring finger deflects when the removable module is connected to said set-top box.

7. The guide member of claim 1, wherein the at least one thermally conductive element comprises a fin extending across at least a portion of said guide member.

8. The guide member of claim 7, wherein the fin begins at a first edge of the guide member and terminates at a second edge of the guide member.

9. The guide member of claim 1, wherein the thermally conductive element includes a plurality of spring fingers arranged in rows and columns and a plurality of fins disposed in between at least one of said rows and columns of said plurality of spring fingers.

10. A method of managing thermal energy dissipation via a guide member that receives a removable module that electrically connects to circuitry when the removable module is inserted into the guide member, comprising conducting thermal energy away from said removable module into ambient air through at least one thermally conductive element including at least one spring finger extending from a surface of said guide member that is in physical contact with the removable module when said removable module is placed in said guide.

11. The method of claim 10, further comprising conducting the thermal energy with a plurality of spring fingers that are in physical contact with said removable module when said removable module is connected to a set-top box.

12. The method of claim 10, further comprising integrally forming the spring finger with the guide member.

13. The method of claim 10, further comprising deflecting the spring finger when the removable module is connected to said set-top box.

14. The method of claim 10, wherein the thermally conductive element comprises a fin extending across at least a portion of said guide member.

15. The method of claim 10, further comprising arranging a plurality of spring fingers in rows and columns and a plurality of fins in between at least one of said rows and columns of said plurality of spring fingers.

16. The method of claim 10, further comprising aligning and guiding said removable module into proper connection with a module connector, said aligning and guiding being performed by the guide member.

17. A method of operating a set-top box, said method comprising:
    inserting a removable module in a port of said set-top box, said port comprising a guide that engages said module and guides said module into connection with circuitry of said set-top box;
    conducting thermal energy generated by said removable module into said guide and away from said removable module, said thermal energy being conducting into an element of said guide that is in physical contact with an exterior of said removable module;
    engaging said exterior of said removable module with a plurality of spring fingers that extend from said guide and conduct thermal energy from said module into said guide; and
    arranging said spring fingers in rows and columns.

18. The method of claim 17, further comprising disposing a fine between columns of said spring fingers to increase a surface area of said guide for releasing thermal energy.

* * * * *